United States Patent [19]

Reinke

[11] Patent Number: 4,851,839
[45] Date of Patent: Jul. 25, 1989

[54] DUAL-SLOPE ANALOG-TO-DIGITAL CONVERTER WITH VOLTAGE TO CURRENT CONVERTER

[75] Inventor: James D. Reinke, New Hope, Minn.

[73] Assignee: Honeywell Inc., Minneapolis, Minn.

[21] Appl. No.: 895,972

[22] Filed: Aug. 12, 1986

[51] Int. Cl.[4] .............................................. H03M 1/50
[52] U.S. Cl. ................................... 341/128; 341/166; 341/167; 324/99 D
[58] Field of Search ................. 340/347 NT, 347 AD, 340/347 M, 347 C, 347 CC; 324/49 D; 341/127, 128, 129, 166, 167, 155

[56] References Cited

U.S. PATENT DOCUMENTS

| 4,217,543 | 8/1980 | Strong | 340/347 NT |
| 4,309,692 | 1/1982 | Crosby | 340/347 NT X |
| 4,420,743 | 12/1983 | Upadhyayula | 340/347 AD |

OTHER PUBLICATIONS

Strong, Rough Life of Digital Multimeter . . . ; Electronics, Jun. 23, 1977, pp. 107–112.
The Engineering Staff of Analog Devices, Inc., Analog–Digital Conversion Handbook, 6/1972, pp. II–32 to II–34; III–1 to III–14; and III–46 to III–56.
The Engineering Staff of Analog Devices, Inc., Analog–Digital Conversion Handbook, 6/1972, pp. II–35 to III–37.
Datel Datasheet for the 12–Bit Converter With Microprocessor Interface ADC 7109, published in 1983 by Datel Inc.

Primary Examiner—William M. Shoop, Jr.
Assistant Examiner—Brian K. Young
Attorney, Agent, or Firm—W. T. Udseth

[57] ABSTRACT

An analog-to-digital converter is provided based on supplying various multiplexed inputs, including analog input signal samples, to a voltage-to-current converter charging and discharging an integrated capacitor. A comparator determines the status of this capacitor to a control counter to provide digital representations.

20 Claims, 4 Drawing Sheets

DUAL-SLOPE ANALOG-TO-DIGITAL CONVERTER WITH VOLTAGE TO CURRENT CONVERTER

REFERENCE TO COPENDING APPLICATIONS

Reference is hereby made to copending application by J. Reinke entitled "Voltage-to-Current Converter" having Serial No. 6/892,617 which was filed on Jul. 31, 1986 and which is assigned to the same assignee as the present application. This copending application discloses one embodiment of a subsystem having a capability used in a system disclosed in the present application.

BACKGROUND OF THE INVENTION

The present invention relates to analog-to-digital signal converters, and more particularly, to converters which use a "dual slope" conversion process.

In recent times there has been a great increase in the use of digital methods to provide various manipulations of information signals. A large body of theory has been developed for digital signal processing, and many digital signal processing systems have been put in place by software programs developed for general purpose and special purpose digital computers. More recently, advances in monolithic integrated circuit design and fabrication have lead to monolithic integrated circuit chip microprocessors and dedicated digital signal processors which have greatly increased the use of digital signal processing techniques because such chips can lead to drastic reductions in cost.

Nevertheless, the origin of many of the signals to be processed are of such a nature as to provide the information obtained therefrom in analog signal form. This leads to the requirement for a system which can receive analog input signals and provide a sequence of digitized samples suitable for use in a subsequent digital processing system. A large number of such systems, usually termed analog-to-digital converters or ADCs, are known. Some are specially suited to providing high sampling rates but usually at the cost of accuracy, while others provide highly accurate samples but often at the cost of a slower sampling rate. Various converters representing compromises between sampling rates and accuracy exist.

One well known method for obtaining accurate digital conversion values of samples from analog signals but at a relatively slow sampling rate is the "dual slope" method. In this method, an input analog signal having relatively slow value changes is provided, usually through some sort of a buffer such as an operational amplifier based voltage follower, to an operational amplifier integrator. Each sample of this signal is time integrated for a fixed time duration and stored on the integration capacitor. Thereafter, a negative reference voltage is applied to the integrator until the voltage across the integration capacitor in the operational amplifier integrator substantially returns to zero for that sample. The time taken to discharge this integrator capacitor, kept by a counter driven by a clock, gives a digital representation of the value of the input signal at the time of each sample.

This representation can be shown to depend, in the absence of circuit error sources, on just the value of the reference voltage, the fixed time duration of charging the integrator capacitor and the time of discharge. Thus, at least to first order, the digital representation does not depend on any component values in the system which means a high accuracy can be achieved.

This arrangement, however, cannot provide sampling of negative input analog signals without the addition of at least a further reference voltage of an opposite polarity. Also, this arrangement does not permit sampling differential voltages as a difference between two substantial input analog voltages which is often where information is carried from an analog source or sources.

However, such a conversion scheme can be converted to a differential arrangement using standard operational amplifiers by the use of a so called "instrumentation amplifier" which uses two input operational amplifiers to drive a third operational amplifier. A suitable resistor based feedback loop is provided around each amplifier.

While such an arrangement would provide a differential signal sampling capability, there are also a number of drawbacks. Because the differential voltages in the analog input signals may be small differences between either quite large or quite small pairs of input analog signals, the common mode rejection ratio and the power supply rejection ratio must be very large if unacceptable errors are not to be introduced into the system. This can only be achieved in such an arrangement by use of extremely well matched resistors, so matched over the entire range of operating conditions. In addition, the use of standard operational amplifiers in resistor feedback loops would lead to large ground current voltage drop problems, substantial power consumption, and a large physical size when implemented in monolithic integrated circuit form because of the need to supply substantial currents through the resistors.

Thus, an alternative means of providing "dual slope" conversions is desired. Such an alternative means should be capable of being implemented in a monolithic integrated circuit chip to reduce cost and should be compatible with digital control portions of the system also being formed in such a chip.

SUMMARY OF THE INVENTION

This invention provides a converter based on supplying various multiplexed inputs, including analog input signal samples, to a voltage-to-current converter which charges and discharges an integrating capacitor. A control and timing system operating this arrangement and receiving signals from a comparator measuring the status of the integrating capacitor provides digital representations of the analog input voltage samples.

DESCRIPTION OF THE PREFERRED EMBODIMENT

Figure 1:
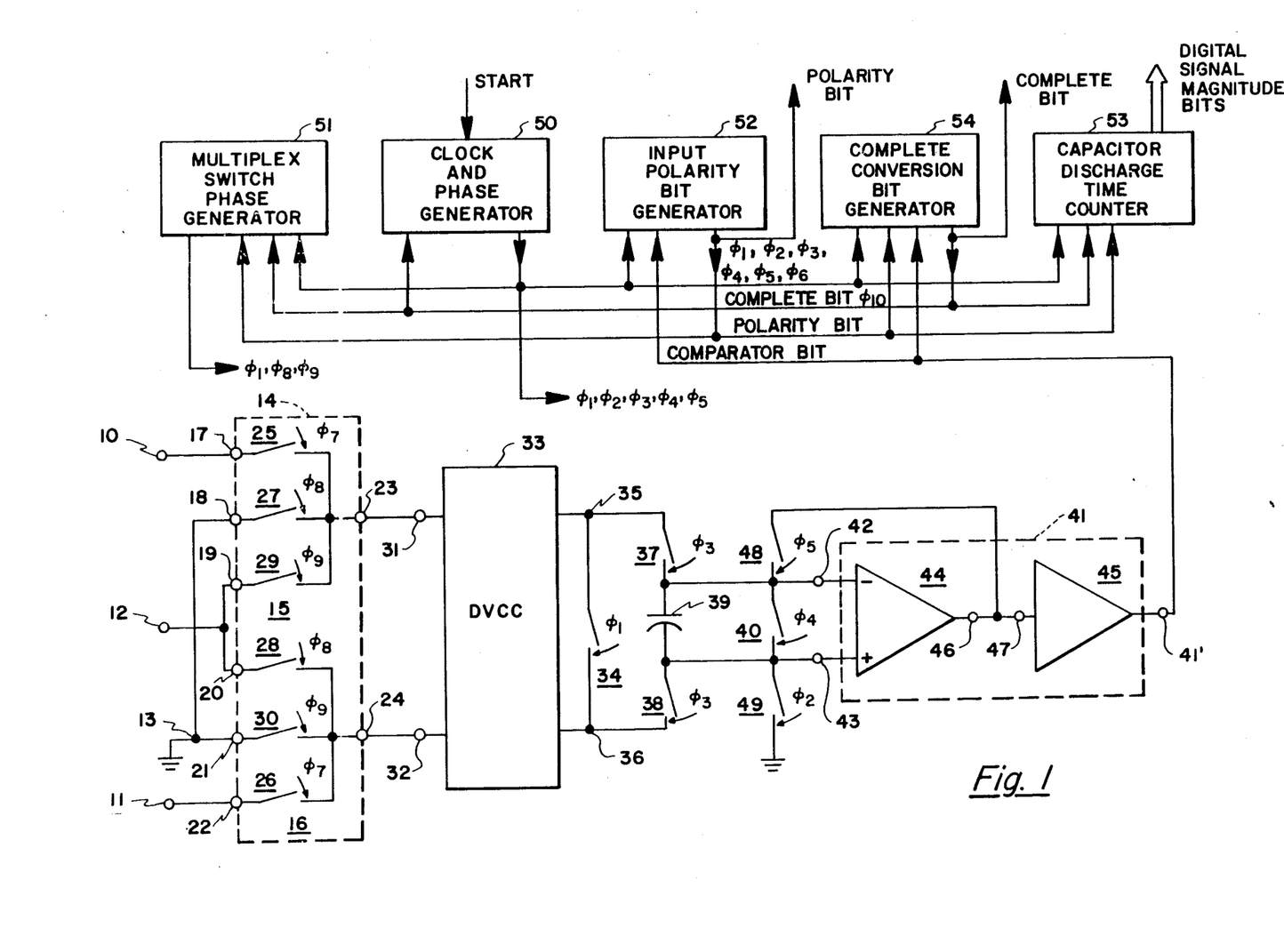
FIG. 1 shows a schematic diagram of the system of the present invention.

The system diagram shown in FIG. 1 has two input terminal means or regions, 10 and 11, at which analog input signals are provided and from which samples are to be taken for conversion into an equivalent digital representation. If the value of just one input analog signal is to be sampled and converted to a digital representation, that input analog signal may be applied to either of input analog regions 10 or 11 with the other region being electrically connected to ground.

A highly accurate reference voltage is applied to a further reference input terminal or region, 12, as a reference basis for finding the value of signals applied to either regions 10 or 11 or both. Finally, a ground reference voltage is applied to another reference voltage input terminal or region, 13.

All of these input terminals or regions are electrically connected to the input regions of a converter system input multiplexing arrangement, 14, shown in a switching schematic diagram in FIG. 1. This arrangement shown contains two separate multiplexers, 15 and 16. Each of multiplexers 15 and 16 are shown having three input regions thereof electrically connected to the various converter system input regions just mentioned. That is, an input region, 17, in multiplexer 15 is connected to a converter system analog signal at terminal 10. Another input region, 18, of multiplexer 15 is connected to ground reference input terminal 13. The last input region, 19, of multiplexer 15 is connected to the converter system reference voltage input terminal 12.

Similarly for multiplexer 16, an input region, 20, is electrically connected to a converter system reference voltage terminal 12. Another input region, 21, of multiplexer 16 is connected to converter system ground reference terminal 13. The final input region, 22, of multiplexer 16 is connected to a converter system analog signal at region 11.

Multiplexer 15 has an output region, 23, and multiplexer 16 has an output region, 24. Each of the input regions of multiplexer 15 can selectively be connected to output region 23 thereof through the application of proper logic state voltages to the control regions of multiplexer 15, and disconnected from output 23 through other logic state voltage combinations being applied to the control regions in multiplexer 15. The control regions are shown in FIG. 1 as being one region for each switch although this is not the only way multiplexers are constructed.

Exactly the same selective electrical connection and disconnection of the input regions of multiplexer 16 can be made to output region 24 thereof. Again, such connections and disconnections are made under the control of logic state voltage signals applied to control regions for the various switches in multiplexer 16.

As shown in FIG. 1, the logic state voltages are generated as phases of a basic clock signal so that the corresponding switches are closed in the proper time and sequence relationship with other switches in the system controlled by other phases of the same clock. Thus, a switch, 25, of multiplexer 15 for connecting and disconnecting input region 17 to output region 23 thereof is controlled by a clock phase signal designated $\phi_7$ applied to the control region of multiplexer 15 for that switch. This is also true for a switch, 26, of multiplexer 16 which, under control of the same signal, connects or disconnects input region 22 to output region 24 thereof.

Likewise, the clock phase signal designated $\phi_8$ is used to control a switch, 27, connecting input region 18 with output region 23 of multiplexer 15. Clock phase signal $\phi_8$ also controls a switch, 28, connecting input region 20 with output region 24 of multiplexer 16.

The final clock phase signal used with multiplexing arrangement 14 is designated $\phi_9$ and controls a switch, 29, which connects input region 19 to output region 23 of multiplexer 15. Clock phase signal $\phi_9$ also controls the connecting and disconnecting of input region 21 to output region 24 of multiplexer 16 by a switch, 30.

Output region 23 of multiplexer 15 is electrically connected to a first input region, 31, of a differential voltage-to-current converter. Output region 24 of multiplexer 16 is electrically connected to a second input region, 32, of the same differential voltage-to-current converter. This differential voltage-to-current converter, 33, more fully described in the copending application referenced above, is an analog signal converter having current output regions 35 and 36 with a shorting switch, 34, connected between. If properly energized by voltage sources, converter 33 provides an electrical current analog signal through its output regions, and in and out of any circuit components connected therebetween which can pass such current, in response to any differences occurring in the voltages applied to input regions 31 and 32 thereof.

As shown in FIG. 1, output shorting switch 34 between output regions 35 and 36 of converter 33, if closed, permits converter 33 to reach a settled, steady state after application of voltages to inputs 31 and 32 before providing current to other components connected between these outputs. This is important if the output current of converter 33 is to reflect only the value of the voltage difference between its inputs and not any added switching induced transient currents. Switch 34 is controlled by a clock phase signal designated $\phi_1$ for opening and closing this switch.

Two further switches, 37 and 38, serve to connect and disconnect such an integrating capacitor, 39, between output regions 35 and 36 of converter 33. Switches 37 and 38 are each controlled by a clock phase signal designated $\phi_3$.

Integrating capacitor 39 can be discharged or permitted to charge by a switch, 40, connected thereacross. Switch 40 is controlled by a clock phase signal designated $\phi_4$ for this purpose.

Also across capacitor 39 is a comparator means, 41. Comparator means 41 has a first input region, 42, a second input region, 43, and an output region, 41'. Input regions 42 and 43 have a relatively high circuit impedances. Comparator means 41 will provide a first logic state voltage at output region 41' if voltage occurring between input regions 42 and 43 exceeds a threshold value but will provide the opposite logic state voltage if this voltage is less than such threshold value.

Comparator means 41 is formed by an operational amplifier, 44, and a threshold switch, 45. The inverting and non-inverting inputs to operational amplifier 44 serve as the first input region 42 and second input region 43, respectively, of comparator means 41. Thus, they have a relatively high circuit impedance to be certain that no current is shunted away from integrating capacitor 39 which would lead to erroneous results. Amplifier 44 will also have a high gain as is typical of operational amplifiers between its output region, 46, and inverting input region 42 or non-inverting input region 43.

Threshold switch 45 has an input region, 47, and its output region serves as comparator output region 41'. Threshold switch 45 will be capable of providing an output voltage of a first logic state value at output region 41' if the voltage applied to input region 47 is less than a threshold voltage, but will provide an opposite logic state voltage value if the input voltage in input region 47 exceeds this threshold voltage. Such a threshold switch can be provided simply by use of an inverter circuit, but various kinds of "triggering" circuits could be used.

Operational amplifier output 46 can be connected to the inverting input region 42 thereof through a switch means, 48. Switch means 48 is controlled by a clock phase signal designated $\phi_5$. The non-inverting input of operational amplifier 44 can be connected to and disconnected from ground voltage reference by a further switch, 49. Switch 49 is controlled by a clock phase signal designated $\phi_2$.

The clock phase signals for controlling the various switches and the multiplexers are generated by a clock and phase generator, 50, and by a multiplex switch phase generator, 51. While the converter system could be operated on a continual basis recycling through its sampling and conversion sequence continually, generator 50 is shown to have a start logic signal provided thereto as might be provided by a microprocessor included in a larger system also including the converter system. Thus, a conversion would begin only on the presence of proper logic state for the start signal. The various clock phase signals are formed in generators 50 and 51 on the basis of a signal provided from a crystal oscillator provided to well known logic gate circuits based on well known logic system design techniques.

The switches between analog converter 33 and comparator 41, and the switches in the multiplexers, are generally formed of insulated gate field-effect transistors (IGFETs), specifically metal-oxide field-effect transistors (MOSFETs). The control signals, or clock phase signals from generators 50 and 51, are applied to the gate regions of these devices.

Some of these clock phase signals and the signal at the output of comparator 41, the comparator bit, are together used to form the various outputs from the conversion system. Thus, there is an input polarity bit generator, 52, which provides a bit indicating the polarity of the differential voltage applied to conversion system analog signals inputs 10 and 11. The capacitor discharge time counter, 53, provides the magnitude bits which together with the polarity bit form the digital output signals which represent the digital equivalent of analog input signal difference samples. Finally, a complete conversion bit generator, 54, provides a bit signaling that a conversion of an analog sample to an equivalent digital representation has been completed and that the system is ready to receive another start bit to perform another conversion.

Figure 2:
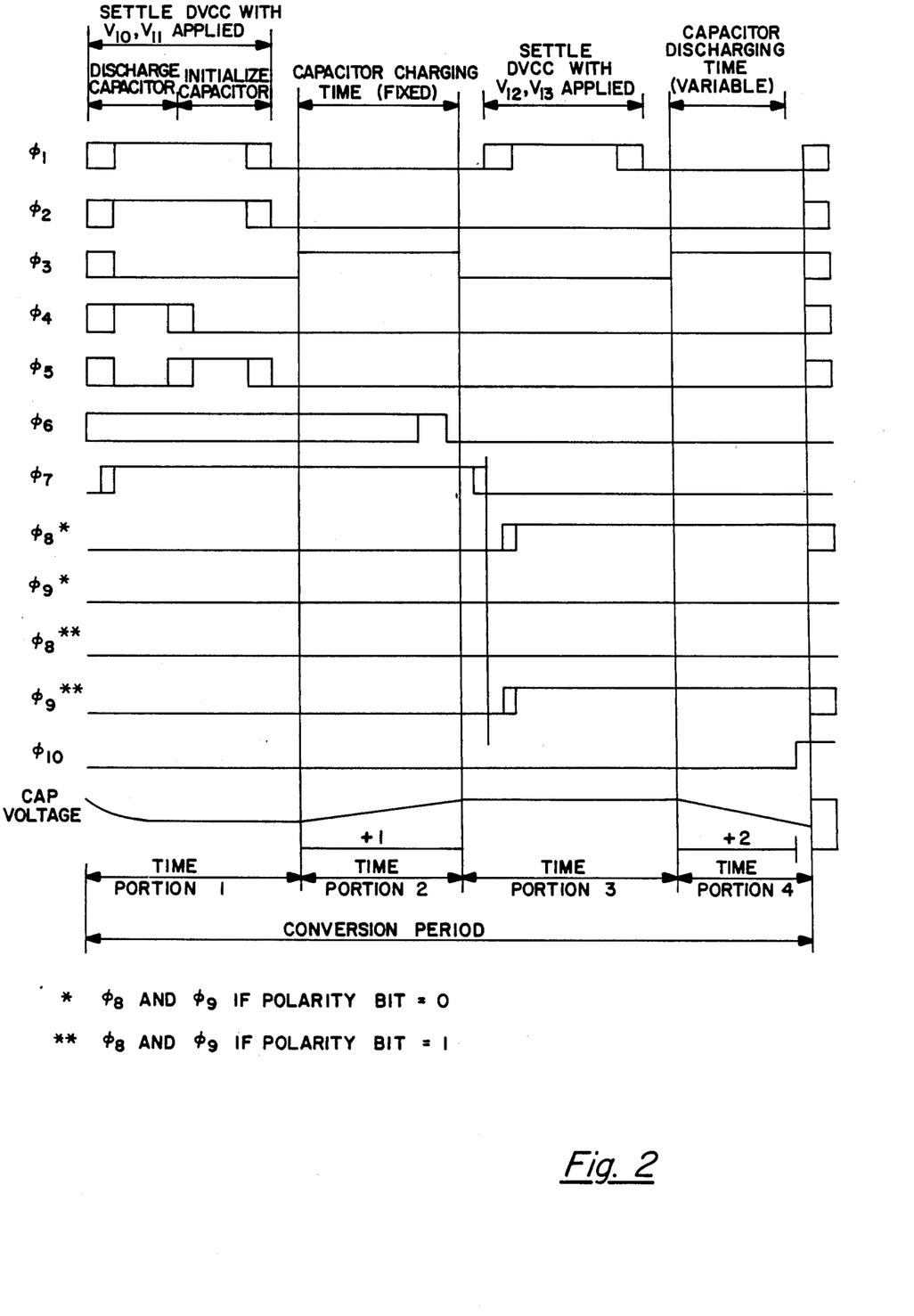
FIG. 2 shows a timing diagram for various signals in the system of the present invention.

In operation, the period in which a conversion is performed by the conversion system can be divided into four primary portions. During two of these primary time portions, analog converter 33 and integrating capacitor 39 are prepared for the charging and discharging of capacitor 39. In the other two time portions, capacitor 39 is charged and discharged. These primary time portions in a system conversion period are shown in FIG. 2.

In the first primary time portion, the differential voltage-to-current converter 33, that is, analog converter 33, is permitted to settle any transients occurring therein because of the switching by multiplexers 15 and 16 of the input analog signals at input regions 10 and 11 to have them applied to converter 33. Further, capacitor 39 is discharged of voltage remaining thereon from the previous conversion period, and is initialized for reference purposes for charging in the new conversion period.

Clock phase signal $\phi_7$ is in the high logic state closing switches 25 and 26 so that any analog input signals appearing on conversion system input regions 10 and 11 are directly applied to input regions 31 and 32 of analog converter 33. Clock phase signal $\phi_1$ is also in the high logic state closing switch 34 so that so that a transient free current can be established through the outputs of converter 33 in response to any difference in the voltages appearing on inputs regions 31 and 32. Clock phase signal $\phi_3$ is in the low logic state opening switches 37 and 38 so that capacitor 39 is not in the output circuit of analog converter 33 during this time.

Clock phase signal $\phi_4$ is in the high logic state so that switch 40 is closed to provide a circuit to discharge integrating capacitor 39. This discharging continues for part of the time in this first primary time portion of the conversion system period, but thereafter clock phase signal $\phi_4$ will go to the low logic state to open switch 40 with the discharging of capacitor 39 having been completed.

The setting of the initial voltage state of integrating capacitor 39 is then begun with the opening of switch 40 by having clock phase signal $\phi_5$ go to the high logic state to close switch 48. Clock phase signal $\phi_2$ is kept in the high logic state so that the non-inverting input of operational amplifier 44 is given a ground voltage reference through switch 49. In this circumstance in the latter part of the first primary time portion, with the feedback loop closed through switch 48 about operational amplifier 44, integrating capacitor 39 will be driven to an initial state voltage approximating the offset voltage occurring at the input of operational amplifier 44. In addition to the amplifier offset voltage contribution to the initial state voltage, there will also be reflected the loop error voltage, capacitor dielectric absorption voltage and switch injected voltage.

This initialization voltage established on integrating capacitor 39 sets the reference point on capacitor 39 for subsequent measurement purposes. Thus, by the end of this first primary time portion capacitor 39 has been brought to an initial state as a reference against which future measurements are to be made, the voltages at system input regions 10 and 11 have settled on input regions 31 and 32 of converter 33 after the closing of switches 25 and 26, and analog converter 33 has any resulting transient effects therein settled out. Clock signal phases $\phi_6$, $\phi_8$, $\phi_9$ and $\phi_{10}$ all remain in the low logic state.

During the second primary time portion of a conversion period, integration capacitor 39 is charged for a predetermined fixed period of time, $t_1$. During this time switches 25 and 26 remain closed as clock phase signal $\phi_7$ continues at the high logic state voltage. The other switches in multiplexers 15 and 16 are open (only one switch is closed in either multiplexer at any time). Clock phase signal $\phi_1$ is in the low logic state so that switch 34 is open. Clock phase signals $\phi_2$ and $\phi_5$ are both in the low logic state so that switches 48 and 49 are open reflecting the completion of the setting of integration capacitor 39 to an initial condition. Clock phase signal $\phi_3$ closes switches 37 and 38 to connect capacitor 39 to output regions 35 and 36 of analog converter 33 for charging during this second primary time portion.

Clock phase signals $\phi_1$, $\phi_2$, $\phi_4$, and $\phi_5$ must all have gone to low logic states at times earlier than the time clock phase signal $\phi_3$ goes to the high logic state. This is required so that the respective switches, 34, 49, 40 and 48, are opened before any charging is permitted of capacitor 39 to prevent any upsets caused by the opening of these switches from being reflected in the charge accumulated in capacitor 39.

The rising and falling portions of clock phase signal $\phi_3$ beginning and ending this period should be quite sharp so that the time of integration, $t_1$, is accurately known. This parameter is important in setting the value for the digital equivalent provided by the conversion system for each analog input voltage sample converted.

In the absence of any system errors in analog converter 33, the current provided to flow through integrating capacitor 39 from output region 35 of analog converter 33 to output region 36 is as follows:

$$i_C = \frac{v_{10} - v_{11}}{R}$$

The resistance value R appearing in the foregoing equation is determined by the value of a current setting resistor used in analog converter 33 as explained in the reference to the copending application made above. As is known from circuit theory, the voltage developed across the capacitor in a time duration is equal to the time integral of the current through it for that time duration divided by the capacitance. Assuming that the input analog voltage applied to conversion system input regions 10 and 11 remains essentially constant during the conversion period, the foregoing current will result in the following voltage at the conclusion of time $t_1$ in the absence of any converter system error sources:

$$\begin{aligned} v_C(t_1) &= \frac{1}{C} \int_0^{t_1} i_C dt \\ &= \frac{1}{C} \int_0^{t_1} \frac{v_{10} - v_{11}}{R} dt \\ &= \frac{t_1}{RC} (v_{10} - v_{11}) \end{aligned}$$

However, there are errors occurring in the converter system which must be taken into account to provide an accurate model of performance. As explained in the copending application, the current supplied at the output of analog converter 33 through integrating capacitor 39 will have an error component resulting from certain mismatches therein. Because of the nature of analog converter 33, this current error at output regions 35 and 36 of analog converter 33 can be reflected to input regions 31 and 32 of analog converter 33 as an offset voltage, $v_{osconv}$.

Further, as explained above, integrating capacitor 39 will have an initial voltage upon it as a result of the activities just explained for the first major time portion of the conversion period, and may have some residual effects from earlier time periods. This initial voltage on integrating capacitor 39 will be designated $v_{init}$. In these circumstances, the last equation with the voltage on integrating capacitor 39, assuming that $v_{osconv}$ and $v_{init}$ are constant during the conversion period, is more accurately written as follows:

$$v_C(t_1) = \frac{t_1}{RC} (v_{10} - v_{11} - v_{osconv}) + v_{init}$$

At the end of $t_1$, clock phase signal $\phi_3$ goes to the low voltage state to open switches 37 and 38 and thereby disconnect integrating capacitor 39 from output regions 35 and 36 of analog converter 33. This is the point at which the third primary time portion of the conversion period begins. Clock phase signal $\phi_3$ must go to the low logic state prior to any other switchings occurring during this third primary time portion to again be certain that none of the switching effects could affect the charge accumulated on integrating capacitors 39 during the preceding capacitor charging.

Prior to the end of the second primary time portion of a conversion cycle, comparator means 41 determines the polarity of an difference occurring in the voltages that have been applied to conversion system inputs 10 and 11 in this time portion, and provides an output bit at output region 41' indicating this polarity. Operational amplifier 44 of comparator 41 will also have an offset voltage error at its input, $v_{oscomp}$, as is well known for operational amplifiers. Thus, if $v_c$ on integrating capacitor 39 exceeds $v_{oscomp}$, then a low level logic state will appear at output region 41' of comparator 41. Alternatively, if $v_c$ is less than $v_{oscomp}$, a high level logic state will appear at output region 41'.

This logic state at output region 41' is provided to input polarity bit generator 52 which accepts and stores such comparator bit during the remainder of the conversion period upon sensing the pulse in clock phase signal $\phi_6$. Generator 52 also provides the information carried in the comparator bit at the generator 52 output as the polarity bit. Note that the clock phase signals, other than clock phase signals $\phi_3$, $\phi_6$ and $\phi_7$, are at the low logic state throughout the second primary time portion.

In the third major time portion of the conversion cycle, clock phase signal $\phi_7$ goes to the low logic state voltage opening switches 25 and 26 thereby removing the input analog voltages applied to conversion system inputs 10 and 11 from input regions 31 and 32 of analog converter 33. Thereafter in the third primary time portion, the reference voltage is to be applied to the analog converter 33 for the discharging of integrating capacitor 39. This discharging, which forms the fourth and final primary time portion, lasts until the logic state changes at output region 41' of comparator 41 indicating that the voltage on capacitor 39 has passed the offset voltage voscomp of operational amplifier 44. The duration of such discharging will be designated $t_2$. The duration $t_2$ relative to the duration $t_1$ is the basis for setting the digital equivalent of the sample of the analog input voltage taken for the conversion.

However, as to which of the input regions 31 and 32 of analog converter 33 the reference voltage should be applied depends on the direction in which integrating capacitor 39 was charged during charging time $t_1$. This information is contained in the polarity bit provided by input polarity bit generator 52 which is supplied to multiplex switch phase generator 51. If the polarity bit indicates that the comparator bit provided at comparator output region 41' was in the low logic state voltage, clock phase signal $\phi_8$ will be in the high logic state closing switches 27 and 28. Thereby, the reference voltage $V_{REF}$ is applied to input region 32 of analog converter 33, and the ground reference voltage is applied to input region 31.

Alternatively, if the polarity bit provides the information that the comparator bit at comparator output region 41' was in the high logic state voltage level, clock phase signal $\phi_9$ will go to the high logic state closing switches 29 and 30. $V_{REF}$ will be provided to to input region 31 of analog converter 33, and the ground reference voltage applied to input region 32.

In any event, once reference voltage $V_{REF}$ is applied to analog converter 33, the source of the reference voltage and analog converter 33 are both allowed to have any transients resulting from such application settle out in this third primary time portion. This settling occurs while output regions 35 and 36 of analog converter 33 are shorted together by switch 34 being closed in response to the clock phase signal $\phi_1$ going to the high logic state during much of this time portion. Before the beginning of the fourth major time portion this short is removed between output regions 35 and 36 of analog converter 33 by having the clock phase signal $\phi_1$ go to the low logic level voltage state to open switch 34. Clock phase signals $\phi_2$, $\phi_3$, $\phi_4$, $\phi_5$, $\phi_6$ and $\phi_{10}$ all remain in the low logic state during the third primary time portion.

The final primary time portion of the conversion cycle, during which integrating capacitor 39 is discharged, is set by having clock phase signal $\phi_3$ go to the high logic state level to close switches 37 and 38. This connects integrating capacitor 39 to output regions 35 and 36 of analog converter 33. Clock phase signals $\phi_2$, $\phi_4$ and $\phi_5$ continue in the low logic level voltage states leaving switches 49, 40 and 48 open. The switches in multiplexers 15 and 16 also continue as they were established in the third primary time portion with one or the other of $\phi_8$ and $\phi_9$ in the high logic state and the remaining one in the low logic state. Again, the rising edge of clock signal $\phi_3$ which begins the final time portion and the rising edge of clock phase signal $\phi_{10}$ which marks the end of the discharging of integrating capacitor 39 should be quite sharp so that the measurement of $t_2$ is accurate.

Prior to the beginning of the fourth time period, capacitance discharge time counter 53 has been preset to a zero count if the input polarity bit generator polarity bit indicates that the comparator bit was in the low logic state at the time it was stored in input polarity bit generator 52. The count contained in counter 53 is then incremented at the end of each clock cycle provided by clock phase generator 50 until clock phase signal $\phi_{10}$ goes to the high logic level state as will be described below.

If on the other hand, the polarity bit of input polarity bit generator 52 indicates that the comparator bit was in the high logic state voltage level, capacitor discharge time counter 53 is initially set to the value of one and is incremented at the end of each clock cycle provided by clock phase generator 50 until clock phase cycle $\phi_{10}$ rises to a high logic state voltage level. These two different presets, depending on the voltage value of the polarity bit, means there is a positive zero but not a negative zero. This eliminates the possibility of having the same numerical value take on two different codings.

The count reached by capacitor discharge time counter 53 at the time that clock phase signal $\phi_{10}$ goes to the high logic state voltage level contains the information representing the digital equivalent of the input analog signal values sampled at the beginning of the conversion period in that it represents the number of clock cycles taken to discharge $n_2 = t_2/f_{clock}$. Here, $n_2$ represents the count in the counter, and $f_{clock}$ represents the clock frequency. That such information is contained in $n_2$ will be shown below.

Complete conversion bit generator 54 operates by comparing the polarity bit generated by input polarity bit generator 52 with the comparator bit provided at output region 41' of comparator 41 during the fourth primary time portion of the conversion period. The polarity bit has been stored in input polarity bit generator 52 and is unaffected after such storage by further changes in logic states at output region 41' of comparator 41 during this conversion period.

The logic state will change at output region 41' of comparator 41 as comparator 41 senses the voltage $v_c$ on integrating capacitor 39 changing from being more (less) than $v_{oscomp}$, as established during $t_1$, to being less (more) than $v_{oscomp}$ as a result of the discharging of capacitor 39. When the logic state changes at output region 41' of comparator 41 during this final primary time portion of the conversion period, complete conversion bit generator 54 will provide a high logic state voltage level at its output for the complete bit. This indicates that the conversion is complete, and provides a signal $\phi_{10}$ to terminate counting in capacitor discharge time counter 53. The clock phase signal $\phi_1$, $\phi_6$ and $\phi_7$ are all in the low logic state during this fourth primary time period.

Continuing with the earlier analysis and again assuming that the system is free of errors, the current provided to discharge integrating capacitor 39 by analog converter 33 is as follows:

$$i_c = -\frac{V_{REF}}{R}$$

Given the initial voltage established on integrating capacitor 39 during the charging period $t_1$, the application of this current due to $V_{REF}$ gives the following voltage on capacitor 39:

$$v_C(t_2) = \frac{t_1}{RC}(v_{10} - v_{11}) - \frac{t_2}{RC} V_{REF}$$

Since nominally the capacitor in the absence of system error sources is to be fully discharged, the foregoing equation can be set to zero giving the following result:

$$v_{10} - v_{11} = \frac{t_2}{t_1} V_{REF}$$

Use in the above equation of $t_2$ in terms of the clock frequency and the count in counter 53, and a similar equation based on the same clock frequency for time duration $t_1$ results in the following equation:

$$n_2 = n_1 \frac{v_{10} - v_{11}}{V_{REF}}$$

Since (i) $n_1$ is known as $t_1 = n_1(f_{clock})$ is chosen as a fixed time period, (ii) $V_{REF}$ is a known voltage, and (iii) $n_2$ is available from capacitor discharge time counter 53, the last equation shows that knowledge of $n_2$ is equivalent to knowing the difference between the analog input voltages applied to conversion system analog inputs 10 and 11 at the time of sampling for the conversion. Thus, $n_2$ is a digital representation of the value of the difference in the analog voltages applied to conversion system inputs 10 and 11 for the sample taken during this conversion period.

However, the actual discharging current supplied by analog converter 33 will depend on both the offset of converter 33, $v_{osconv}$, and the polarity of the input difference voltage. The polarity of the input difference voltage determines whether $V_{REF}$ is applied to input region 31 or to input region 32 of converter 33. Depending on which input region $V_{REF}$ is applied, the offset voltage for the converter will either be added thereto or subtracted therefrom. Thus, Polarity bit = 0

$$i_c = \frac{-v_{osconv} - V_{REF}}{R}$$

Polarity bit = 1

$$i_c = \frac{-v_{osconv} + V_{REF}}{R}$$

Furthermore, rather than equating the final voltage on integrating capacitor 39 at the end of discharging time $t_2$ to zero, this voltage should be equated to the offset voltage of operational amplifier 44, $v_{oscomp}$, which is the point at which comparator 41 will switch. Thus, there will be two equations representing the performance of the conversion system, one for each value taken on by the polarity bit. These equations will be as follows:

Polarity bit = 0

$$\frac{t_1}{RC}(v_{10} - v_{11} - v_{osconv}) + v_{init} + \frac{t_2}{RC}(-V_{REF} - v_{osconv}) = v_{oscomp}$$

Polarity bit = 1

$$\frac{t_1}{RC}(v_{10} - v_{11} - v_{osconv}) + v_{init} + \frac{t_2}{RC}(V_{REF} - v_{osconv}) = v_{oscomp}$$

The following definitions will permit showing the solution of these equations in a more simplified form:

$$E_1 = -v_{osconv} + \frac{RC}{t_1}(v_{init} - v_{oscomp})$$

$$E_2 = -\frac{v_{osconv}}{V_{REF}}$$

The pair of equations preceding these definitions can then be rewritten as follows:

Polarity bit = 0

$$\frac{v_{10} - v_{11} + E_1}{1 - E_2} = \frac{t_2}{t_1} V_{REF}$$

Polarity bit = 1

$$\frac{-v_{10} + v_{11} - E_1}{1 + E_2} = \frac{t_2}{t_1} V_{REF}$$

This last pair of equations shows that the error term $E_1$ causes an offset error, and that the other error $E_2$ causes a gain error. Furthermore, the gain is different in the situation where the polarity bit equals zero than it is in the situation where the polarity bit equals one. A plot of these equations would show a change in slope between them occurring about the point $V_{REF}t_2/t_1=0$ leading to a nonlinearity in the converter performance. This gain error, offset error and resulting nonlinearity can be removed from the foregoing equations if error terms $E_1$ and $E_2$ can have the values therefor determined and used to determine either (i) the actual voltages present system analog inputs 10 and 11 in the conversion period, or (ii) the count that should have been present at the end of the conversion period at the output of capacitor discharge time counter 53.

This determination of values for error terms $E_1$ and $E_2$ can be made by the following converter system calibration method. Using the system in the ordinary manner as described above, obtain a first calibration measurement output count $t_{2calb1}$ with $V_{REF}$ applied to input region 31 of analog converter 33, through having switch 29 closed, and with switch 30 closed so that ground is applied to input region 32 of the converter. Then obtain a second calibration measurement output count, $t_{2calb2}$, at the output of capacitor discharge time counter 53 again operating the conversion system in the ordinary manner but with both switches 27 and 30 closed. As a result, ground is applied to each of input regions 31 and 32 of analog converter 33.

For the first measurement, the polarity bit will always be zero. In the second measurement, however, the polarity bit sign will depend on the magnitude and polarity of the offsets occurring in the conversion system and so will sometimes be zero and sometimes be one. These calibration measurement output counts, $t_{2calb1}$ and $t_{2calb2}$ can be used in the following equations to determine the values of the error factors $E_1$ and $E_2$:

Polarity bit = 0 for both calibration measurements $$E_1 = \frac{t_{2calb2}}{t_{2calb2} - t_{2calb1}} V_{REF}$$

$$E_2 = 1 - \frac{t_1}{t_{2calb1} - t_{2calb2}}$$

Polarity bit = 0 for first calibration measurement but is 1 for second $$E_1 = \frac{t_{2calb2}}{t_{2calb1} - t_{2calb2}} V_{REF}$$

$$E_2 = \frac{t_1}{t_{2calb2} - t_{2calb1}} - 1$$

With these error factors so determined, the actual difference in analog voltages appearing in system analog inputs 10 and 11 can be found. They are the following:

Polarity bit = 0

$$v_{10} - v_{11} = (1 - E_2)\frac{t_2}{t_1} V_{REF} - E_1$$

$$= (1 - E_2)\frac{n_2}{n_1} V_{REF} - E_1$$

Polarity bit = 1

$$v_{10} - v_{11} = -(1 + E_2)\frac{t_2}{t_1} V_{REF} - E_1$$

$$= -(1 - E_2)\frac{n_2}{n_1} V_{REF} - E_1$$

The calibration measurements described immediately above can be repeated every so often as deemed necessary to provide updated calibration information to be used in obtaining the input analog voltage difference as set out in the equations just above.

From another view, if the equations just above are compared with those found earlier for a system without any offset errors, a corrected value for the output count time counter 53, $n_{2corr}$, be found for use in place of the actual measured value, $n_{2meas}$, found at the output of capacitor discharge time counter 53. This corrected value can be found from the following:

Polarity bit = 0

$$n_{2corr} = n_{2meas}(1 - E_2) - \frac{E_1 n_1}{V_{REF}} = n_1 \frac{v_{10} - v_{11}}{V_{REF}}$$

Polarity bit = 1

$$n_{2corr} = -n_{2meas}(1 + E_2) - \frac{E_1 n_1}{V_{REF}} = n_1 \frac{v_{10} - v_{11}}{V_{REF}}$$

Thus, $n_{2corr}$ is a digital representation of the value of the difference in the sample taken from analog voltages appearing on converter system inputs during the conversion period.

The system of FIG. 1 can be implemented in the monolithic integrated circuit chip. In this form, the circuitry from the analog signal inputs 10 and 11 through output region 41' of comparator 41 can be provided in the chip in the same manner using the same kinds of components as are used in connection with the forming of analog converter 33 in a chip as described in the above referenced copending application. The remaining portions of the circuitry are digital circuit portions and can be formed in the chip using well known logic circuit and device structures.

Figure 3:
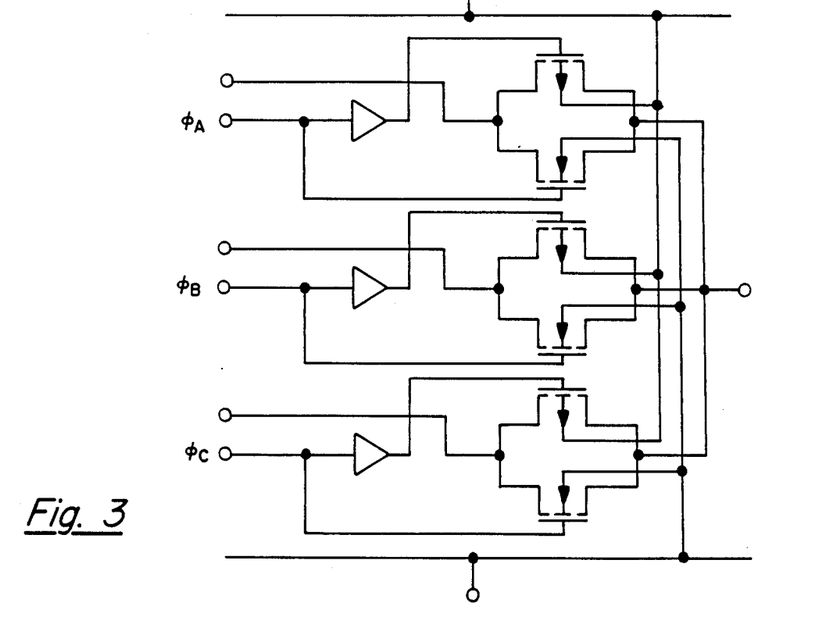
FIG. 3 shows a circuit schematic diagram of the multiplexing switches of the present invention.

Either of input multiplexers 15 or 16 can be formed from the complementary metal-oxide-semiconductor field-effect transistor (CMOS/FET) circuitry shown in FIG. 3. The multiplexer is shown operated by clock phase signals $\phi_A$, $\phi_B$, and $\phi_C$ each driving the input of an inverter and the gate of the n-channel MOSFET transistor used in the analog switch. The p-channel transistor substrates are shown connected to the highest voltage present in the circuit, 15.0 volts, while the n-channel transistor substrates are shown connected to the lowest voltage present in the circuit, $-5.0$ volts. The other terminals located near the clock phase signal terminals are the inputs for the multiplexer while the single terminal on the right hand side is the output. A typical width-to-length ratio for the p-channel transistors is 40/10, while that for the n-channel transistors is 36/18.

Integrating capacitor 34 is typically a very high quality capacitor which is placed in the circuit mounted on a circuit board, as would be the chip, and is not part of the monolithic integrated circuit chip. A typical dielectrical material would be foil Teflon and the capacitor is to have a capacitance value of about 0.1 $\mu$f. The dielectric absorption should be less than 0.01% of the maximum charge permitted on the capacitor if residual voltages from earlier charging and dischargings are to be kept small. Series resistance is chosen to be less than 10 ohms to avoid causing instability in the feedback loop around comparator 41 through switch 48 for setting the initial state of integrating capacitor 39. The shunt resistance must be greater than $10^9 \Omega$ if erroneous values of charge on capacitor 39 are to be avoided because of losses during charging and discharging of this capacitor.

Furthermore, because of the very high output impedance of analog converter 33, there will typically be conductive guard rings provided around the connection points of capacitor 39 to the chip on the external circuit board. The guard ring on the low voltage side of the capacitor will be connected to ground. The guard ring on the high voltage side of the capacitor will be connected to the output region of an operational amplifier which has its non-inverting input connected to the terminal point in the monolithic integrated circuit chip to which the high voltage side of the capacitor is connected. The operational amplifier will be connected in a voltage follower configuration with a direct connection between its output and its inverting input.

In this arrangement, any leakages from the capacitor connection places through paths on the external circuit board will be provided from the integrated circuit rather than causing charge loss on integrating capacitor 39 which would lead to erroneous results. Such a guard ring operational amplifier can be provided on the monolithic integrated circuit chip and should have a very high input impedance with a low input voltage and current offsets, and should have a substantial gain.

Figure 4:
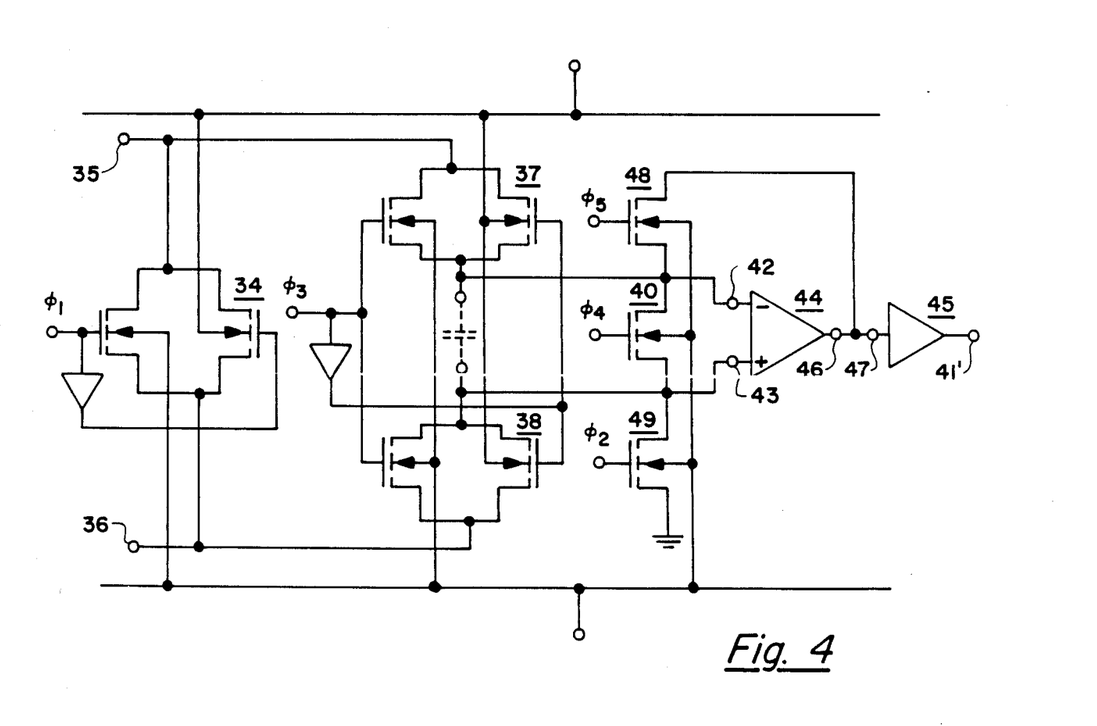
FIG. 4 shows a circuit schematic diagram of the switches used in connection with the charging and discharging of the integrating capacitor of the present invention.

The circuit for the switches used around integrating capacitor 39 is shown in FIG. 4. Switch 34 is again a CMOS analog switch having the n-channel transistor driven by clock phase signal $\phi_1$ while the p-channel transistor in the switch is driven by an inverter which inverter is in turn driven by clock phase signal $\phi_1$. A width-to-length ratio for the n-channel transistor is typically 20/18 while the width-to-length ratio for the p-channel transistor is 20/10.

Similarly, switches 37 and 38 are formed by CMOS analog switches. The n-channel transistors are driven by clock phase signal $\phi_3$, and an inverter uses this signal to drive the p-channel transistors. The n-channel transistors width-to-length ratios are 40/18 and the p-channel transistor ratios are 40/10.

Finally, switches 40, 48 and 49 are each formed of n-channel transistors only. That is because these switches operate near ground potential and are driven by clock phase signals sufficiently large to assure that they will be in the "on" condition when desired. The previous switches in FIG. 4 will at times operate at some voltage away from ground and therefore must have companion p-channel transistor to assure switches are always in the "on" condition when desired.

The width-to-length ratios for the transistors and switches 48 and 49 are 100/18. The width-to-length ratio for the transistor in switch 40 is much larger because of the need to assure that integrating capacitor 39 is fully discharged. This ratio is 1330/18. In every instance, the n-channel transistor substrates are connected to the lowest voltage in the monolithic integrated circuit chip, $-5.0$ volts. The p-channel transistor substrates are connected to the highest voltage in the chip, 15.0 volts.

Figure 5:
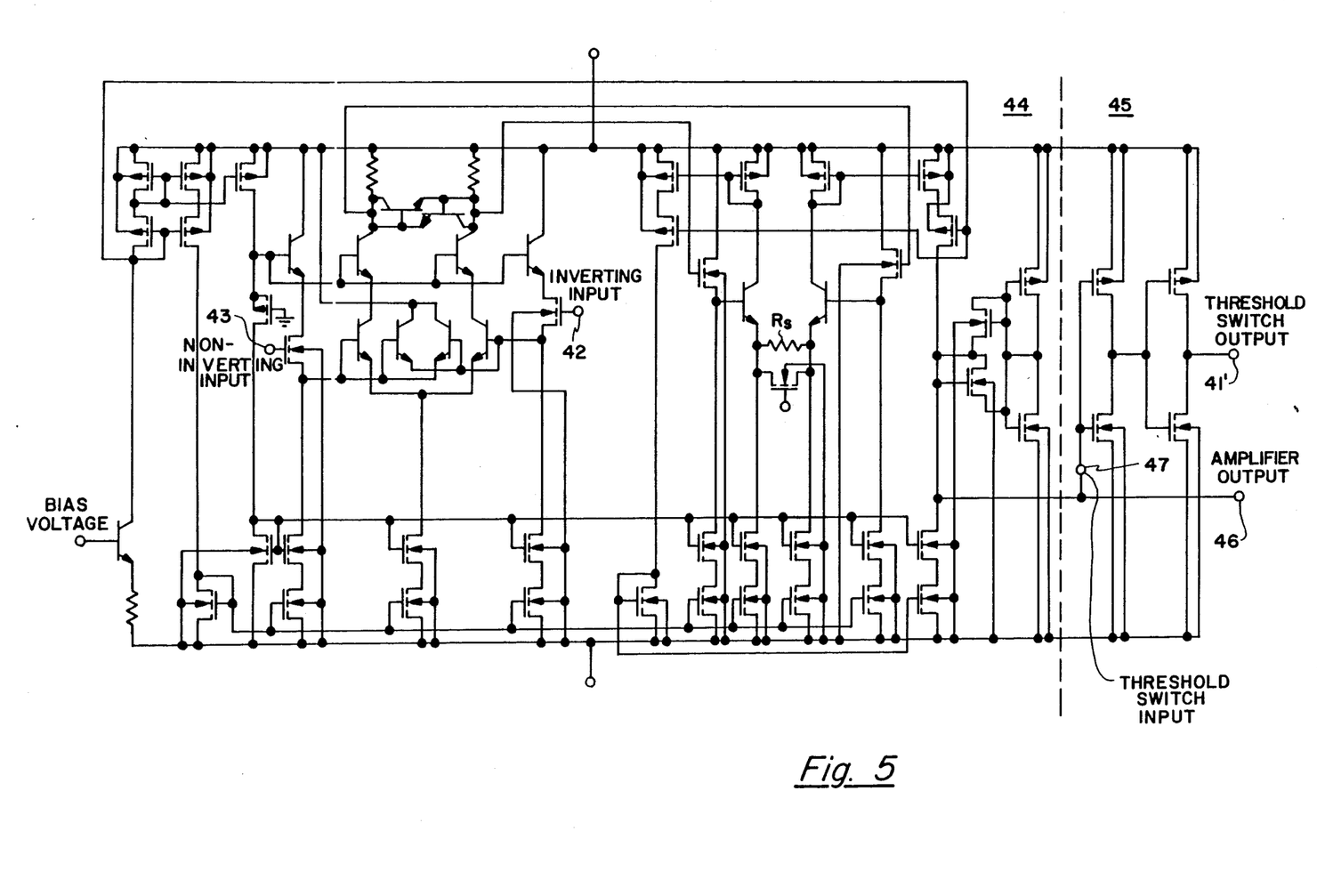
FIG. 5 shows a circuit schematic diagram of a comparator for use in the present invention.

Although a commercially purchased circuit could be used, a circuit suitable for integration in the same chip of the portions of the conversion system is show in schematic diagram form in FIG. 5 for operational amplifier 44 and threshold switch 45. The circuit has a high input impedance because of the use of MOSFET transistors as the input transistors to eliminate currents which would serve to discharge integrating capacitor 39 connected thereacross during circuit operation. Input voltage offset is not a concern because of the establishing of initial voltage conditions on capacitor 39 prior to the start of charging this capacitor as part of performing a conversion.

Operational amplifier 44 is to have a high gain so that it causes threshold switch 45 to switch rapidly as the polarity of the voltage difference on the input changes. The input stage of the amplifier has bipolar transistors and resistors a loads which are "clamped" to limit voltage excursion. These input stage outputs are electrically connected to second stage which converts the output into a push-pull arrangement. The second stage has MOSFET transistor inputs to reduce loading on the first stage and second stage provides a voltage level shift. A clamping circuit is provided on the output of the second stage to limit voltage excursions at the output from coming too close to the power supply voltages, plus 5.0 volts and −5.0 volts. The threshold switch is formed using ordinary CMOS inverters.

Operational amplifier 44 has a 4.3kΩ resistor, $R_S$, in the second stage which is used to provide stability in the feedback loop used when initial conditions are set on integrating capacitor 39. However, an n-channel transistor in parallel therewith is used to in effect short out this resistor during the charging and discharging of integrating capacitor 39 during a conversion to increase gain and rapidity of response of operational amplifier 44.

Remaining portions of operational amplifier 44 are used to set various current and voltage bias conditions for its operation. These conditions are set by the use of a bias voltage supplied from circuits external to that of operational amplifier 44 but formed in the same chip. Threshold switch 45 is provided by cascade connected inverters.

The embodiments of the invention in which an exclusive property or right is claimed are defined as follows:

1. An analog-to-digital signal converter having a first analog signal input region and having a plurality of digital signal output regions, said converter comprising:

a first and second multiplexing means each having a plurality of input regions including a first input region and each having an output region which can be electrically connected to a selected one of its said input regions, said first multiplexing means first input region being electrically connected to said first analog signal input region, and said second multiplexing means first input region being electrically connected to a first terminal means adapted for electrical connection to a first voltage source;

an analog conversion means having first and second input regions and having first and second output regions, said analog conversion means if electrically energized being capable of providing an electrical current output flow, through any circuit components capable of permitting such a current flow therethrough that are electrically connected between said analog conversion means first and second output regions, in response to any differences in voltages applied to said analog conversion means first and second input regions and in a direction depending on that polarity taken by any such differences, said analog conversion means first input region being electrically connected to said first multiplexing means output region, and said analog conversion means second input region being electrically connected to said second multiplexing means output region;

first and second connection means each having first and second terminating regions between which a conductive path can be provided of a selected conductivity, said first connection means first terminating region being electrically connected to said analog conversion means first output region, and said second connection means first terminating region being electrically connected to said analog conversion means second output region;

a capacitor means having first and second terminating regions between which electrical capacitance of a selected value is present, said capacitor means first terminating region being electrically connected to said first connection means second terminating region, and said capacitor means second terminating region being electrically connected to said second connection means second terminating region;

third and fourth connection means each having first and second terminating regions between which a conductive path can be provided of a selected conductivity, said third connection means first terminating region being electrically connected to said capacitor means first terminating region, and said fourth connection means first terminating region being electrically connected to said capacitor means second terminating region;

a comparator means having a first input region which is capable of a relatively high circuit impedance, a second input region which is capable of a relatively high circuit impedance, and an output region, said comparator means being capable of providing an output voltage of substantially a selected first value at said comparator means output region if a voltage signal having a value less than a selected first threshold value is provided between said comparator means first and second input regions, and being capable of providing an output voltage of substantially a selected second value at said comparator means output region if a voltage signal having a value exceeding said first selected threshold value is provided at said comparator means first and second input regions, said comparator means first input region being electrically connected to said third connection means second terminating region, and said comparator means second input region being electrically connected to said fourth connection means second terminating region; and a control and timing means having an input region and a plurality of output regions including said plurality of digital signal output regions, said control and timing means input region being electrically connected to said comparator means output region, said control and timing means being capable of selecting said first multiplexing means first input region for electrical connection to said first multiplexing means output region for a selected first duration during which said capacitor means can be charged by said analog conversion means in response to any differences in voltages applied to said analog conversion means first and second input regions, and thereafter being capable of selecting said second multiplexing means first input region for electrical connection to said second multiplexing means output region for a second time duration sufficient to substantially discharge any charge accumulated in said capacitor means during said first time duration, said control and timing means providing a representation of said second time duration at said digital signal outputs.

2. The apparatus of claim 1 wherein said first multiplexing means further comprises a second input region and said second multiplexing means further comprises a second input region, said first multiplexing means second input region being electrically connected to a second terminal means adapted for electrical connection to a second voltage source, and said second multiplexing means second input region being electrically connected to a third terminal means adapted for electrical connection to a third voltage supply.

3. The apparatus of claim 1 wherein said first connection means also has a control region therein by which said first connection means is capable of being directed to effectively provide a selected conductivity in said conductive path between said first connection means first and second terminating regions, and said second connection means also has a control region therein by which said second connection means is capable of being directed to effectively provide a selected conductivity in said conductive path between said second connection means first and second terminating regions, said first connection means control region being electrically connected to a said control and timing means output region, and said second connection means control region being electrically connected to a said control and timing means output region.

4. The apparatus of claim 1 wherein said third connection means is formed by a direct interconnection, and said fourth interconnection means is formed by a direct interconnection.

5. The apparatus of claim 1 wherein said comparator means comprises an operational amplifier and a threshold switch, said operational amplifier having a first input region which is capable of a relatively high circuit impedance, a second input region which is capable of a relatively high circuit impedance, and an output region, said operational amplifier means being capable of providing a large magnitude gain in an opposite magnitude direction for signals appearing at said operational amplifier output region over corresponding signals appearing at said operational amplifier first input region, said operational amplifier being capable of providing a large magnitude gain in an identical magnitude direction for signals appearing at said operational amplifier output region over corresponding signals appearing at said operational amplifier second input region, said operational amplifier first input region serving as said comparator means first input region and said operational amplifier second input region serving as said comparator means second input region, said threshold switch having an input region and an output region, said threshold switch being capable of providing an output voltage of substantially said first value at said threshold switch output region of a voltage signal having a value less than a selected second threshold value is provided at said threshold switch input region, and being capable of providing an output voltage of substantially said second value at said threshold switch output region if a voltage signal having a value exceeding said second selected threshold value is provided at said threshold switch input region, said threshold switch input region being electrically connected to said operational amplifier output region.

6. The apparatus of claim 2 wherein said converter also has a second analog signal input region, said first multiplexing means further comprises a third input region, and said second multiplexing means further comprises a third input region, said first multiplexing means third input region being electrically connected to a fourth terminal means adapted for electrical connection to a fourth voltage source, and said second multiplexing means third input region is electrically connected to said second analog signal input region.

7. The apparatus of claim 3 wherein said converter further comprises a fifth connection means having first and second terminating regions and having a control region therein by which it is capable of being directed to effectively provide a conductive path of a selected conductivity between said fifth connection means first and second terminating regions, said fifth connection means control region being electrically connected to a said control and timing means output region, said fifth connection means first terminating region being electrically connected to said analog conversion means first output region, and said fifth connection means second terminating region being electrically connected to said analog conversion means second output region.

8. The apparatus of claim 3 wherein said converter further comprises a fifth connection means having first and second terminating regions and having a control region therein by which it is capable of being directed to effectively provide a conductive path of a selected conductivity between said fifth connection means first and second terminating regions, said fifth connection means control region being electrically connected to a said control and timing means output region, said fifth connection means first terminating region being electrically connected to said capacitor means first terminating region, and said fifth connection means second terminating region being electrically connected to said capacitor means second terminating region.

9. The apparatus of claim 5 further comprises a fifth connection means having first and second terminating regions and having a control region therein by which it is capable of being directed to effectively provide a conductive path of a selected conductivity between said fifth connection means first and second terminating regions, said fifth connection means control region being electrically connected to a said control and timing means output region, said fifth connection means first terminating region being electrically connected to said operational amplifier output region, and said fifth connection means second terminating region being electrically connected to said operational amplifier first input region.

10. The apparatus of claim 6 wherein said first multiplexing means also has a control region therein by which said first multiplexing means is capable of being directed to electrically connect a selected one of said first multiplexing means input regions to said first multiplexing means output region, and wherein said second multiplexing means also has a control region therein by which said second multiplexing means is capable of being directed to electrically connect a selected one of said second multiplexing means input regions to said second multiplexing means output region, said first multiplexing means control region being electrically connected to one of said control and timing means output regions, and said second multiplexing means control region being electrically connected to a said one of said control and timing means output regions.

11. The apparatus of claim 6 wherein said converter further comprises a fifth connection means having first and second terminating regions and having a control region therein by which it is capable of being directed to effectively provide a conductive path of a selected conductivity between said fifth connection means first and second terminating regions, said fifth connection means control region being electrically connected to a said control and timing means output region, said fifth connection means first terminating region being electrically connected to said analog conversion means first output region, and said fifth connection means second terminating region being electrically connected to said analog conversion means second output region.

12. The apparatus of claim 6 wherein said comparator means comprises an operational amplifier and a threshold switch, said operational amplifier having a first input region which is capable of a relatively high circuit impedance, a second input region which is capable of a relatively high circuit impedance, and an output region, said operational amplifier means being capable of providing a large magnitude gain in an opposite magnitude direction for signals appearing at said operational amplifier output region over corresponding signals appearing at said operational amplifier first input region, said operational amplifier being capable of providing a large magnitude gain in an identical magnitude direction for signals appearing at said operational amplifier output region over corresponding signals appearing at said operational amplifier second input region, said operational amplifier first input region serving as said comparator means first input region and said operational amplifier second input region serving as said comparator means second input region, said threshold switch having an input region and an output region, said threshold switch being capable of providing an output voltage of substantially said first value at said threshold switch output region of a voltage signal having a value less than a selected second threshold value is provided at said threshold switch input region, and being capable of providing an output voltage of substantially said second value at said threshold switch output region if a voltage signal having a value exceeding said second selected threshold value is provided at said threshold switch input region, said threshold switch input region being electrically connected to said operational amplifier output region.

13. The apparatus of claim 7 wherein said converter further comprises a sixth connection means having first and second terminating regions and having a control region therein by which it is capable of being directed to effectively provide a conductive path of a selected conductivity between said sixth connection means first and second terminating regions, said sixth connection means control region being electrically connected to a said control and timing means output region, said sixth connection means first terminating region being electrically connected to said capacitor means first terminating region, and said sixth connection means second terminating region being electrically connected to said capacitor means second terminating region.

14. The apparatus of claim 7 wherein said fifth connection means comprises a field-effect transistor.

15. The apparatus of claim 8 wherein said fifth connection means comprises a field-effect transistor.

16. The apparatus of claim 9 wherein said converter further comprises a sixth connection means having first and second terminating regions and having a control region therein by which it is capable of being directed to effectively provide a conductive path of a selected conductivity between said sixth connection means first and second terminating regions, said sixth connection means control region being electrically connected to a said control and timing means output region, said sixth connection means first terminating region being electrically connected to said operational amplifier second input region, and said sixth connection means second terminating region being electrically connected to a fifth terminal means adapted for connection to a fifth voltage source.

17. The apparatus of claim 9 wherein said fifth connection means comprises a field-effect transistor.

18. The apparatus of claim 11 wherein said converter further comprises a sixth connection means having first and second terminating regions and having a control region therein by which it is capable of being directed to effectively provide a conductive path of a selected conductivity between said sixth connection means first and second terminating regions, said sixth connection means control region being electrically connected to a said control and timing means output region, said sixth connection means first terminating region being electrically connected to said capacitor means first terminating region, and said sixth connection means second terminating region being electrically connected to said capacitor means second terminating region.

19. The apparatus of claim 12 further comprises a fifth connection means having first and second terminating regions and having a control region therein by which it is capable of being directed to effectively provide a conductive path of a selected conductivity between said fifth connection means first and second terminating regions, said fifth connection means control region being electrically connected to a said control and timing means output region, said fifth connection means first terminating region being electrically connected to said operational amplifier output region, and said fifth connection means second terminating region being electrically connected to said operational amplifier first input region.

20. The apparatus of claim 19 wherein said converter further comprises a sixth connection means having first and second terminating regions and having a control region therein by which it is capable of being directed to effectively provide a conductive path of a selected conductivity between said sixth connection means first and second terminating regions, said sixth connection means control region being electrically connected to a said control and timing means output region, said sixth connection means first terminating region being electrically connected to said operational amplifier second input region, and said sixth connection means second terminating region being electrically connected to a fifth terminal means adapted for connection to a fifth voltage source.

* * * * *